United States Patent [19]

Honda

[11] 4,197,637
[45] Apr. 15, 1980

[54] AUTOMATED ASSEMBLY APPARATUS FOR PRINTED CIRCUIT BOARDS

[75] Inventor: Yasuhiro Honda, Tanashi, Japan

[73] Assignee: Citizen Watch Co., Ltd., Tokyo, Japan

[21] Appl. No.: 897,468

[22] Filed: Apr. 18, 1978

[30] Foreign Application Priority Data

Apr. 22, 1977 [JP] Japan .................................. 52/46454

[51] Int. Cl.² ........................ H05K 3/32; H05K 13/02
[52] U.S. Cl. ...................................... 29/741; 29/784; 29/785
[58] Field of Search .............. 29/739, 741, 701, 704, 29/759, 784, 822–825, 564.1, 564.6, 564.7, 564.8

[56] References Cited

U.S. PATENT DOCUMENTS 4,063,347  12/1977  Woodman, Jr. .................... 29/741 X

*Primary Examiner*—Carl E. Hall
*Attorney, Agent, or Firm*—Frank J. Jordan

[57] ABSTRACT

An automated assembly apparatus for inserting electrical parts into a printed circuit board includes parts supply means for supplying parts to parts conveyance means according to a predetermined sequence. The parts conveyance means is equipped with parts conveyance jigs and an identification code the detection of which determines the parts which are delivered to each jig for eventual conveyance to parts insertion means equipped with a plurality of chucks adapted to successively transfer the delivered parts, regardless of their size and shape, to an awaiting circuit board, and to insert the parts into the circuit board at prescribed positions according to a predetermined sequence.

11 Claims, 5 Drawing Figures

AUTOMATED ASSEMBLY APPARATUS FOR PRINTED CIRCUIT BOARDS

This invention relates to an automated assembly apparatus in which a plurality of components such as diodes and resistors are automatically inserted into a printed circuit board, and more particularly to an automated assembly apparatus for a printed circuit board assembled by inserting a large variety of components at prescribed positions.

Heretofore many attempts have been made to construct automated machines which can assemble printed circuit boards by inserting components such as diodes and resistors, performing soldering and forming circuitry, and machines capable of delivering high productivity have been disclosed. All of these machines, however, could only assemble circuit boards that carry parts of a single type or of the same shape, and thus were not capable of dealing with components of diverse shapes and sizes. In the past, therefore, circuit boards were assembled by a number of different steps or machines, and there were cases where small numbers of parts had to be supplied and installed by hand. Although there are without doubt many cases where parts of only a single or small variety of shapes and sizes occupy the major portion of a single circuit board, there are many instances in which circuit boards possess parts of diverse shapes and sizes, such as the circuit boards which are employed in television circuitry.

It is, therefore, an object of the present invention provide an automated assembly apparatus for printed circuit boards adapted to assemble, through the utilization of only a single apparatus, a circuit board which carries components that differ widely in terms of shape and size.

It is another object of the present invention to provide an automated assembly apparatus adapted to insert into a circuit board a small number of parts which could until now only be supplied and installed by hand, specially shaped parts such as fuses, fuse holders and IFT intermediate frequency transformers, parts such as coils, as well as such typical components as diodes and resistors.

These and other objects, features and advantages of the present invention will become more apparent from the following description when taken in conjunction with the accompanying drawings, in which.

Figure 1:
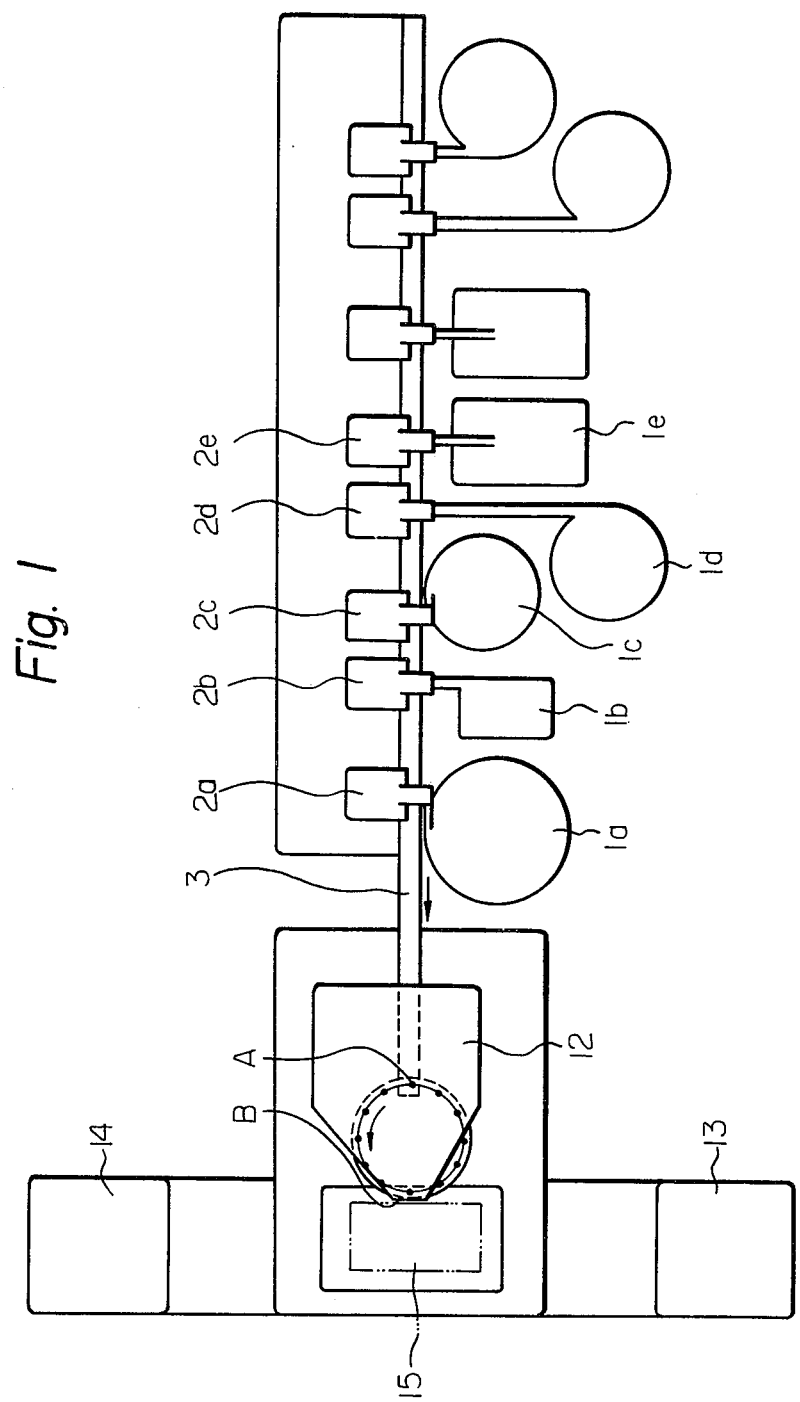
FIG. 1 is a plan view which illustrates the concept of the automated assembly apparatus for printed circuit boards according to the present invention.
Figure 2:
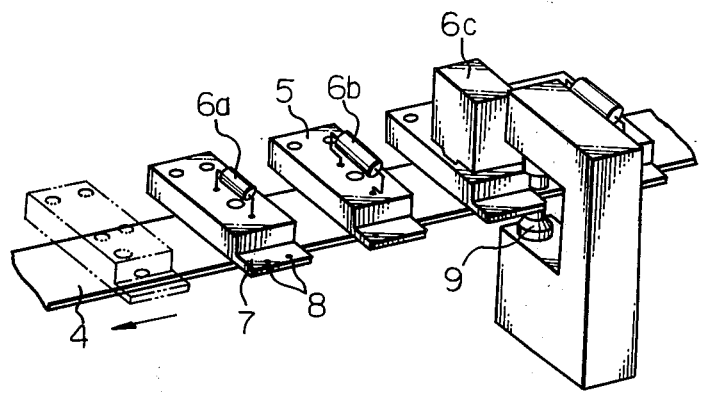
FIG. 2 is a perspective view of parts conveyance and detection means according to a 1st embodiment of the present invention.
Figure 3:
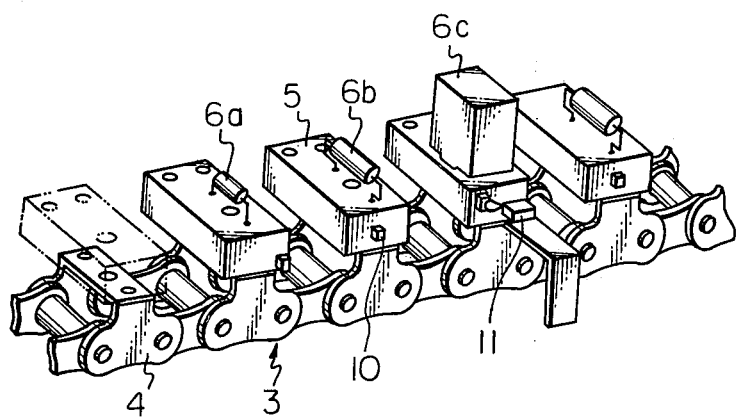
FIG. 3 is a perspective view of parts conveyance and detection means according to a 2nd embodiment of the present invention.

Referring now to FIGS. 1, 2 and 3, parts supply devices 1a, 1b, 1c . . . are comprised of such well-known parts delivery means as a tape carrier, an electromagnetic vibratory-type parts feeder or a magazine supply device, supply units 2a, 2b, 2c . . . adapted to supply to a parts conveyance jig 5 the parts which have been delivered by the parts delivery means, and detection means to be described hereinafter. The combination comprising the parts delivery means and supply units is well known in the art and need not be described here. Parts conveyance means 3, shown in detail in FIGS. 2 and 3, includes parts conveyance jigs 5 worked so as to conform to the shape and dimensions of respective parts and disposed in a given order on jig conveyance means 4 such as a chain or belt, and adapted to carry to a relay station A a number of parts 6a, 6b, 6c . . . which have been delivered to the parts conveyance jigs 5. Each parts conveyance jig 5 is also provided with an identification code for identifying the kind of part being conveyed, this information being detected by the detection means of the parts supply device. In FIG. 2, jig conveyance means 4 is a belt, particularly a steel belt, provide with suitably spaced holders for mounting the parts conveyance jigs or, when necessary, for meshing with a sprocket wheel which drives the belt. Identification code 7 is located at a prescribed position of each parts conveyance jig 5 and shown as composed of one or a plurality of throughholes 8 the positions of which are detected by a photo-electric tube device 9 serving as the detecting means for detecting and discriminating among the conveyed parts. Although the drawings depict only throughholes 8, it is obvious that the photo-electric tube device 9 can be used for the detecting purpose by making use of slits or stripes of light and dark shades formed on a reflecting plate, wherein the reflected light is detected. In the embodiment of FIG. 3, on the other hand, the jig conveyance means 4 makes use of a chain, projections 10 are provided on the side surface of the parts conveyance jig 5 and serve as the identification code, and a limit switch or proximity switch 11 is adopted as detection means, whereby conveyed parts are discriminated among in a manner similar to that described above. It is also obvious than an indexing table could be employed as the jig conveyance means, with the parts supply devices being arranged along its outer periphery.

The parts insertion device 12 includes a printed circuit board supply device 13 and a printed circuit board accommodation device 14 disposed respectively on either side, and is adapted to grasp parts conveyed to relay station A by parts conveyance means 3, insert the parts into a circuit board 15 delivered to an insertion station B by the printed circuit board supply device, and deliver the completed circuit boards to the accommodation device 14.

Figure 4:
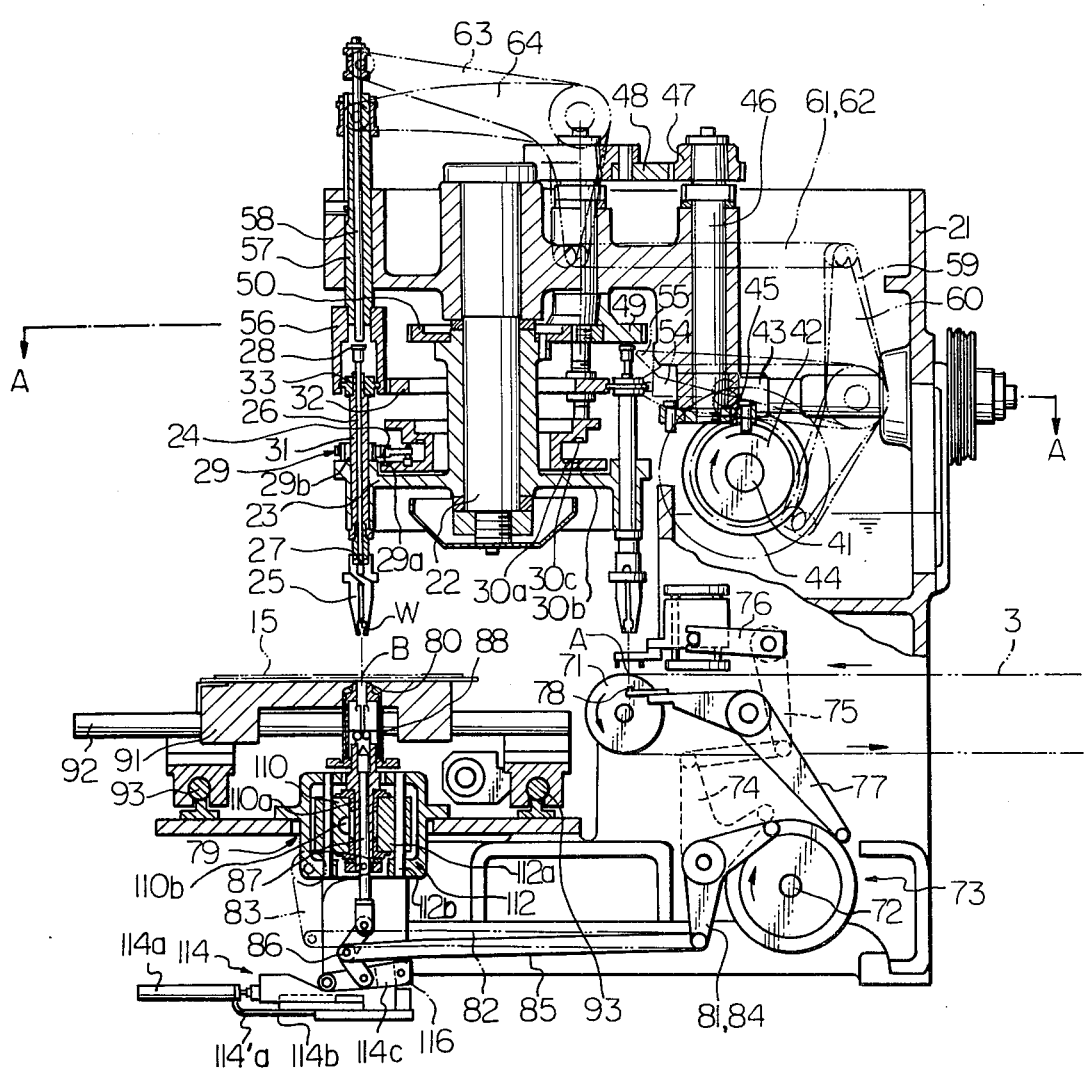
FIG. 4 is a front view of a parts insertion device for a section taken along lines B—B of FIG. 5.
Figure 5:
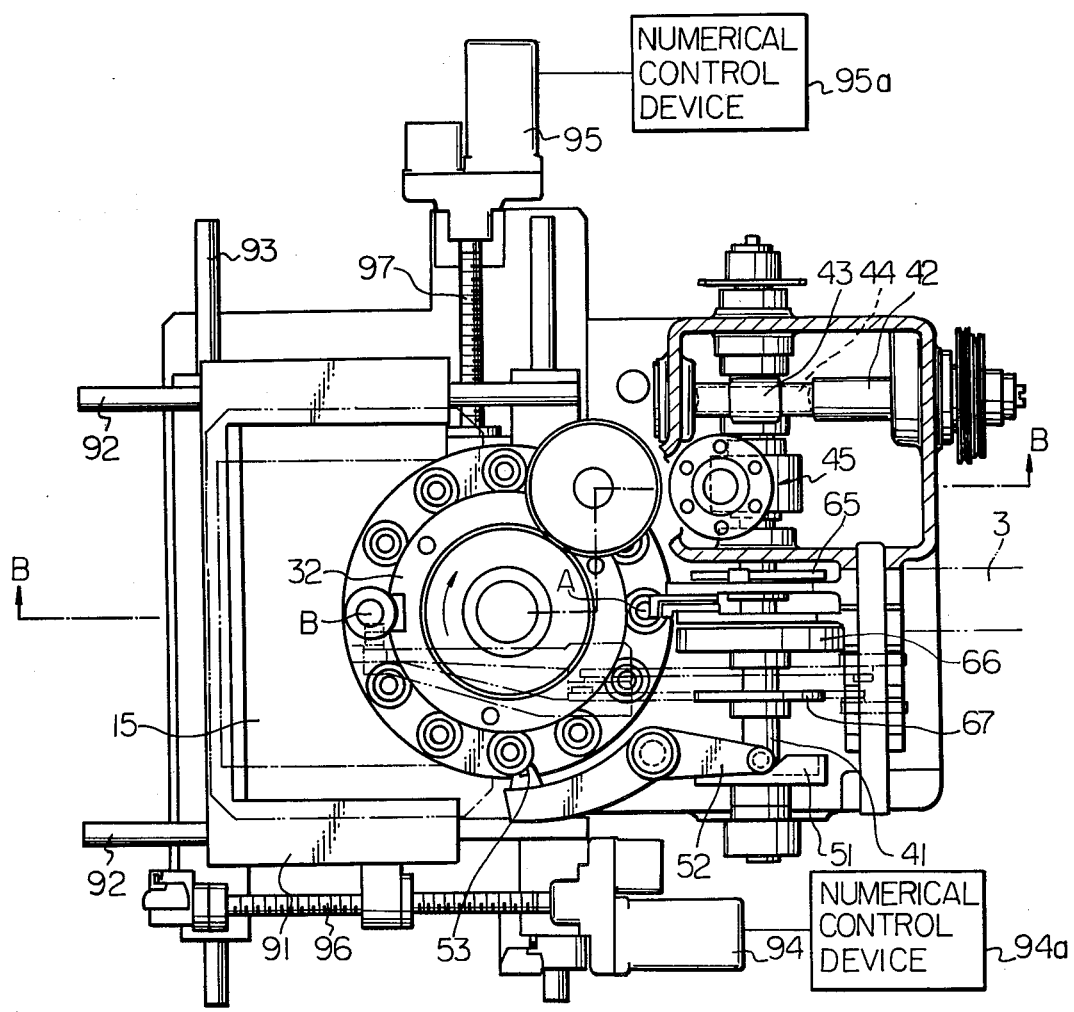
FIG. 5 is a plan view of a parts insertion device for a section taken along lines A—A of FIG. 4.

FIGS. 4 and 5 show the automated parts insertion device in detail, wherein FIG. 4 is a longitudinal sectional view and FIG. 5 a transverse sectional view. The parts insertion device 12 is provided with a turret drum 23 supported by a center shaft 22 which is vertically suspended from the frame 21, and includes a plurality of chuck shafts 24 equally spaced and disposed about the circumference of the turret drum 23. Each chuck shaft 24 is hollow and slidingly accommodates a rod 26 adapted to open and close a chuck 25 located at the lower end. The rod 26 is equipped at its lower end with a conical portion 27 which opens the jaws of the chuck 25 when inserted between the rear portion of the chuck jaws, and closes the chuck when a circular plate 28 at the upper end of the shaft is pulled upwardly. Centrally located about chuck shaft 24 is a chuck shaft rotating device 29 which works in cooperation with grooved cams 30a, 30b, 30c secured to frame 21 above turret drum 23. Bringing a cam follower 31 into engagement with any one of the grooved cams while the turret drum is being indexed from relay station A to insertion station B causes the chuck shaft rotating device 29 to rotate ±90° and 180° the parts to be inserted into the circuit board 15, whereby the polarity of the parts can be made to agree with the polarities specified by circuitry on the circuit board 15. The rotating device 29 comprises a rack 29a formed on the cam follower 31 and a pinion 29b in meshing engagement with the rack 29a and rotable with the shaft 24 when the turret drum 23 is indexed. Disposed above the turret drum 23 is a guide ring 32 that engages with a collar 33 at the upper portion of chuck shaft 24 in order to prevent the chuck shaft from descending at positions other than the relay station A and insertion station B. A main cam shaft 41 is reduced in speed and rotated at a prescribed frequency by means of a worm 43 and a worm wheel 44 of a worm shaft 42 driven by a driving source (not shown). The main cam shaft 41 through the intermediary of barrel cam means 45 intermettently rotated as intermediate shaft 46 that in turn intermittently rotates the turret drum 23 through intermediate gears 47, 48 and 49, 50. The intermediate gears 47, 48 are interchangeable so that the speed reduction ratio can be suitably changed as required by the number of chuck shafts provided on the turret drum. The turret drum 23 is positioned by means of a positioning pin 53 erected on the turret drum and retained by a positioning lever 52 that is operated by a bell cam 51 mounted on main cam shaft 41.

The guide ring 32 is notched at the relay and insertion stations A, B. A projection about the outer periphery of collar 33 shifts from a groove in guide ring 32 to a groove in a chuck shaft raising and lowering lever 54 when at the relay station A, and to a groove in an arm 56 when at the insertion station B, whereby the upward and downward movement of chuck shaft 24 accompanies the upward and downward movement of the lever 54 or arm 56. At relay station A the chuck shaft raising and lowering lever 54 is caused to rock through direct drive applied by a groove cam 56 attached to main cam shaft 41, whereby chuck shaft 24 is raised or lowered. A chuck opening lever 55 is rocked by a plate cam 65, thereby rainsing the circular plate 28 at the upper end of the rod 26 which thus allows the jaws of the chuck 25 to close. At insertion station B, on the other hand, collar 33 at the upper end of chuck shaft 24 is supported by arm 56, as described above, and arm 56 which is concentric with the chuck shaft is mounted on a raising and lowering shaft 57 attached to frame 21. Shaft 57 is hollow and slidingly accommodates a chuck opening rod 58. A grooved cam 66 and plate cam 67 mounted on main cam shaft 41, cam levers 59, 60, links 61, 62 and levers 63, 64 cooperate to raise and lower the shaft 57 and chuck opening rod 58, whereby a part W is inserted into a printed circuit board, after which the jaws of the chuck 25 are opened by lowering the chuck opening rod 58.

The parts conveyance means 3 is driven intermittently by means of a driving wheel 71 that rotates in synchronism with turret drum 23, and is controlled by a cam group 73 attached to an auxiliary cam shaft 72 that rotates in synchronism with main cam shaft 41. More specifically, a positioning device 76 operated by a cam lever 74 and linkage 75 is adapted to position parts conveyance means 3 such that the parts are accurately located when reaching the relay station A, a pushing pin 78 at the end of a cam lever 77 being adapted to push parts upwardly from their respective jigs so that they can be grasped by the jaws of the chuck 25.

Located below the parts insertion station B is a clinching mechanism 79 adapted to bend and thus fix the legs of parts which have been inserted into and through a circuit board, with clinching jaws 80 being rotatable so as to conform to the directional alignment of an inserted part, while the clinching width is automatically adjustable so that the legs of a part can be bent regardless of their spacing. A clinching mechanism rotating device 110 is shown as comprising a pinion 110a rotatable with the shaft 87, and a rack 110b in meshing engagement with the pinion 110a and adapted to be actuated by a suitable actuator such as a cylinder (not shown), to permit rotation of the clinch mechanism 79 independence on the rotational angle of the chuck 25. Owing to the cams attached to the auxiliary cam shaft 72, clinching mechanism 79 is raised and lowered through the intermediary of a cam lever 81, link 82 and lever 83, and a toggle joint 86 is operated through a cam lever 84 and link 85, thereby raising a clinching shaft 87 having at its end a conical portion 88 that closes the clinching jaws 80 so as to clinch the legs of an inserted part. To raise and lower the clinch mechanism 79, the lever 83 is operatively connected to and actuates a slide 112a slidably supported by a stationary guide shaft 112b extending parallel to the shaft 87, the slide 112a and shaft 112b forming a part of a raising and lowering mechanism 112. Indicated as 114 is a mechanism for adjusting the jaw spacing of the clinch mechanism 79. This mechanism comprises a cylinder 114a serving as an actuator and having a piston rod 114'a, a horizontally movable cam 114b, and a cam follower 114c actuated by a cam 114b. The cam follower 114c is pivotally supported by a shaft 116 and has its intermediate portion connected to the toggle joint 86, to vary the lower end of the toggle joint 86 for thereby adjusting the space between the clinching jaws 80.

Circuit boards into which parts are to be inserted are delivered by the circuit board support device 13 and placed on a working station 91 which is supported by and both longitudinally and transversely slidable on a pair of guide shafts 92, 93. Servo motors or pulse motors 94, 95 numerically controlled and driven by numerical control devices 94a, 95a and ball screws 96, 97 are adapted to shift and position the circuit boards so that the positions at which parts are to be inserted are brought into coincidence with the parts insertion station B.

The automated assembly apparatus of the present invention operates as follows. In FIG. 1, parts supply devices 1a, 1b, 1c are adapted to sort and deliver parts to be inserted in circuit boards and may include any well-known parts delivery means best suited for handling parts having different shapes and dimensions. As stated earlier, a tape carrier, electro-magnetic vibratory-type parts feeder or magazine supply device will suffice, as well as means of a similar type. Since each parts conveyance jig 5 secured to jig conveyance means 4 possesses identification code 7 for identifying each carried part, detection means 9 or 11 of the parts supply devices 1a, 1b, 1c . . . detects the identity of the carried parts so as to set in motion only the supply device adapted to supply the particular part to be carried by the designated parts conveyance jig. It goes without saying that indentical parts are delivered from the same parts supply device whenever the parts conveyance jig arrives at that particular supply device. Thus, the driving wheel 71 of the parts insertion device 12 intermittently drives the respective parts conveyance jig 5 which, when reaching the proper parts supply devices 1a, 1b, 1c . . . , are provided with parts that are delivered from each supply device and then carried to the relay station A of the parts insertion device 12.

The parts delivered to the relay station A are pushed upward by pin 78 from the parts conveyance jigs 5 that have been accurately positioned by the positioning device 76. Meanwhile, a chuck shaft 24 at the relay station A is lowered to the position of an awaiting part by the chuck shaft raising and lowering lever 54, after which the chuck opening lever 55 that has descended with lever 54 is raised to pull up and thus elevate the circular plate 28 at the upper end of chuck opening and closing rod 26; hence, since only rod 26 is raised, the conical portion 27 at its end is extracted form the jaws of chuck 25 thereby causing the jaws to close on and grasp the part at the relay station. Next, raising the lever 54 brings the bridge 33 at the upper end of the chuck shaft to the position of the guide ring 32.

At the same that a chuck 25 at the relay station A grasps a part, a chuck 25 which has been indexed to insertion station B while grasping a part W is lowered along with the raising and lowering shaft 57 and chuck shaft 24 by virtue of lever 64 which is operated due to the rotation of grooved cam 66 acting through cam lever 60 and link 62. Thus, the chuck 25 inserts the part W into a printed circuit board 15 of which the proper insertion holes have been located at insertion station B through a process to be described hereinafter. Next, cam group 73 mounted on auxiliary cam shaft 72 acts through cam levers 81, 84, and links 82, 85 to operate lever 83 which raises the clinching mechanism 79 and cause toggle joint 86 to elevate clinching shaft 87, thereby closing clinching jaws 80 which clinches the legs of a part protruding from the bottom of a circuit board 15. After completion of the clinching operation, plate cam 67, acting through cam lever 59, link 61 and lever 63, causes chuck opening rod 58 to lower chuck opening and closing rod 26 such that the conical portion 27 at its lower end opens the jaws of chuck 25 to thereby release the part, whereafter chuck shaft 24 is raised and the clinching mechanism lowered to its original position. At this time the conical portion 27 at the lower end of rod 26 is situated within the jaws of chuck 25 so that the cylindrical portion of rod 26 is interposed between the upper portion of the jaws and prevents closure of the jaws even when the chuck opening rod 58 is retracted from the circular plate 28. Thus, the jaws of the chuck remain open until the chuck opening lever 55 at relay station A raises the rod 26.

After the chuck shafts at each of the stations A, B have been raised, the turrent drum 23 is indexed by one pitch to bring the next chuck shaft into position and repeat the relay-insertion cycle. The parts conveyance means 3 is advanced intermittently by driving wheel 71 in step with the indexing of the turrent drum 23 so that parts are successively delivered to the relay station A. Servo motors or pulsed motors 94, 95 driven and controlled by numerical control devices 94a, 95a rotate ball screws 96, 97 such that the insertion holes in the printed circuit board 15 are properly positioned at the insertion station B. When the turret drum 23 is in the process of being indexed, the collar 33 of the chuck shaft 24, which until then has been supported either by the chuck shaft raising and lowering lever 54 at station A or the arm 56 at station B, is shifted into the groove provided in the guide ring 32 so as to prevent the chuck shaft from descending. Thus, as described above, the chuck shaft is rotated by the chuck shaft rotating device 29 in cooperation with grooved cam 30 in order to suitably orient the part which is being grasped.

Printed circuit boards to be provided with parts are supplied one at a time from the printed circuit board supply device 13 of FIG. 1 and delivered to the parts insertion device 12 where the parts insertion cycle is performed a required number of times. A printed circuit board which has been fully assembled is then accommodated by the accommodation device 14 and is replaced at the parts insertion device 12 with a new circuit board delivered by the supply device 13.

In accordance with the automated printed circuit board assembly apparatus of the present invention, any suitable parts supply device can be freely selected for supplying parts to conveyance jigs that convey the parts to a parts insertion device where a plurality of chucks insert the parts into printed circuit boards regardless of the shape and dimensions of the parts. Accordingly, circuit boards can be automatically assembled from parts having a variety of different shapes and sizes, whereby parts which were formerly installed by hand can now be inserted into a circuit board and fixed in a completely automatic manner.

What is claimed is:

1. An automated assembly apparatus for assembling printed circuit boards and electrical components, comprising:

parts conveyance means including jig conveyance means for conveying each of said plurality of electrical components to a relay station and a plurality of parts conveyance jigs secured thereto;

parts supply means including parts feeders for supplying prescribed electrical components to said parts conveyance jigs, respectively, according to a predetermined assembly sequence; and parts insertion means including a plurality of chucks for grasping said each of said electrical components, that have been delivered to said relay station by said parts conveyance means, and inserting said electrical components into the printed circuit boards in a successive manner;

each of the parts conveyance jigs including an identification code for identifying the electrical components being supplied, detection means for detecting said identification code, a prescribed parts supply device being operated responsive to the detection means, whereby electrical components are supplied to said parts conveyance jigs.

2. The assembly apparatus according to claim 1, wherein the parts insertion means includes a plurality of chucks which are selectively employed and have jaws capable of adapting to the shape of parts to be inserted into the circuit boards.

3. The assembly apparatus according to claim 1, wherein the jig conveyance means comprises a chain.

4. The assembly apparatus according to claim 1, wherein the jig conveyance means comprises a belt, provided with holes spaced apart by a prescribed distance.

5. An automated assembly apparatus for assembling a plurality of electrical components and printed circuit boards, comprising:

parts conveyance means for conveying each of said plurality of parts to a relay station;

printed circuit boards supply means for feeding each of said printed circuit boards to a parts insertion station spaced apart from said relay station; and parts insertion means including a rotatable turret drum disposed above said relay station and said parts insertion station, a plurality of chuck means supported by said turret drum at circumferentially spaced positions thereof, means for rotating said turret drum such that each of said plurality of chuck means is moved to said relay station to grasp said each of said plurality of electrical components that have been delivered to said relay station and subsequently moved to said parts insertion station to insert said electrical components into the prescribed position of said printed circuit boards.

6. The assembly apparatus according to claim 5, wherein said parts insertion means further includes means for rotating said each of said plurality of chuck means to have the electrical components grapsed by said chuck means to agree with the directional alignment of the prescribed positions of said printed circuit boards.

7. The assembly apparatus according to claims 5 or 6, further comprising a clinching mechanism located below said parts insertion station to bend and fix legs of the electrical components which have been inserted into and through the printed circuit boards.

8. The assembly apparatus according to claim 7, in which said clinching mechanism includes a rotatable clinching jaws, and means for rotating said clinching jaws so as to conform to the directional alignment of an inserted electrical component.

9. The assembly apparatus according to claim 7, in which said clinching mechanism includes means for raising and lowering said clinching jaws.

10. The assembly apparatus according to claim 7, in which said clinching mechanism includes means for adjusting the clinching width of said clinching jaws.

11. The assembly apparatus according to claim 5, further comprising a working table movably disposed in said parts insertion station, and means for numerically controlling the position of said working table relative to said parts insertion station.

* * * * *